(12) United States Patent
Kobayashi et al.

(10) Patent No.: US 12,415,728 B2
(45) Date of Patent: Sep. 16, 2025

(54) ALUMINUM NITRIDE PLATE

(71) Applicant: NGK Insulators, Ltd., Nagoya (JP)

(72) Inventors: Yoshimasa Kobayashi, Nagoya (JP); Hiroharu Kobayashi, Kasugai-Shi (KR)

(73) Assignee: NGK INSULATORS, LTD., Nagoya (JP)

( * ) Notice: Subject to any disclaimer, the term of this patent is extended or adjusted under 35 U.S.C. 154(b) by 1020 days.

(21) Appl. No.: 17/030,895

(22) Filed: Sep. 24, 2020

(65) Prior Publication Data
US 2021/0009418 A1 Jan. 14, 2021

Related U.S. Application Data

(63) Continuation of application No. PCT/JP2019/013226, filed on Mar. 27, 2019.

(30) Foreign Application Priority Data

Mar. 27, 2018 (WO) .................. PCT/JP2018/012542

(51) Int. Cl.
*C01B 21/072* (2006.01)
*C30B 29/38* (2006.01)
*H01L 21/02* (2006.01)

(52) U.S. Cl.
CPC ........ *C01B 21/0722* (2013.01); *C01B 21/072* (2013.01); *C30B 29/38* (2013.01);
(Continued)

(58) Field of Classification Search
None
See application file for complete search history.

(56) References Cited

U.S. PATENT DOCUMENTS

| 6,051,303 A | 4/2000 | Katsuda et al. |
| 2006/0163605 A1 | 7/2006 | Miyahara |

(Continued)

FOREIGN PATENT DOCUMENTS

| CN | 1755955 | * | 4/2006 |
| JP | H08-157265 A1 | | 6/1996 |

(Continued)

OTHER PUBLICATIONS

Extended European Search Report (Application No. 19775036.7) dated Nov. 17, 2021.

(Continued)

*Primary Examiner* — Sheng H Davis
(74) *Attorney, Agent, or Firm* — BURR PATENT LAW, PLLC

(57) ABSTRACT

An aluminum nitride plate satisfies both of a "relation 1: c1>97.5%" and a "relation 2: c2/c1<0.995" where c1 is a c-plane degree of orientation that is defined as a ratio of a diffraction intensity of (002) plane to a sum of the diffraction intensity of (002) plane and a diffraction intensity of (100) plane when the surface layer of the aluminum nitride plate is subjected to an X-ray diffraction measurement, and c2 is a c-plane degree of (002) plane to the sum of the diffraction intensity of (002) plane and the diffraction intensity of (100) plane when a portion other than the surface layer of the aluminum nitride plate is subjected to the X-ray diffraction. Moreover, in the aluminum nitride plate, a difference in nitrogen content between the surface layer and the portion other than the surface layer is less than 0.15% in weight ratio.

2 Claims, 5 Drawing Sheets

(52) U.S. Cl.
CPC .. *H01L 21/02389* (2013.01); *H01L 21/02433* (2013.01); *C01P 2002/74* (2013.01); *C01P 2002/78* (2013.01); *C01P 2006/80* (2013.01)

(56) References Cited

U.S. PATENT DOCUMENTS

| | | |
|---|---|---|
| 2006/0183625 A1 | 8/2006 | Miyahara |
| 2013/0187170 A1 | 7/2013 | Fukuyama et al. |
| 2015/0194493 A1 | 7/2015 | Sakaguchi et al. |
| 2015/0353355 A1* | 12/2015 | Fukunaga ........... C04B 35/6268 264/626 |

FOREIGN PATENT DOCUMENTS

| | | |
|---|---|---|
| JP | H11-054603 A1 | 2/1999 |
| JP | 2002015840 * | 1/2002 |
| JP | 2011-020900 A1 | 2/2011 |
| JP | 2012-031027 A1 | 2/2012 |
| JP | 2015-133354 A1 | 7/2015 |
| JP | 2016-520992 A1 | 7/2016 |
| KR | 101597882 * | 2/2016 |
| WO | 2011/007762 A1 | 1/2011 |
| WO | 2012/008545 A1 | 1/2012 |
| WO | 2014/159954 A1 | 10/2014 |

OTHER PUBLICATIONS

International Search Report and Written Opinion (Application No. PCT/JP2019/013226) dated May 21, 2019.

\* cited by examiner

FIG. 6

| Tape Raw Material | Plate-shaped Alumina | | | | Spherical Alumina | Plate-shaped/ Spherical | Firing Aid |
|---|---|---|---|---|---|---|---|
| | Particle Diameter (μm) | Thickness (μm) | Aspect Ratio | Used Amount (Mass%) | Used Amount (Mass%) | (Mass Ratio) | Used Amount (Mass%) |
| 1 | 5 | 0.07 | 70 | 42.31 | 52.89 | 0.8 | 4.8 |
| 2 | 7 | 0.1 | 70 | 28.56 | 66.64 | 0.4 | 4.8 |
| 3 | 7 | 0.1 | 70 | 36.24 | 58.96 | 0.7 | 4.8 |
| 4 | 5 | 0.07 | 70 | 44.35 | 55.45 | 0.8 | 0.2 |

FIG. 7

| | Surface Layer | | Lower Layer | | Degree of Orientation | | | Difference In Nitrogen Content (%) | Defects In Surface Layer | Workability |
|---|---|---|---|---|---|---|---|---|---|---|
| | Used Tape | Number of Laminated Layers | Used Tape | Number of Laminated Layers | Surface Layer | Lower Layer | Lower Layer / Surface Layer | | | |
| Specimen 1 | Tape 3 | 4 | Tape 2 | 10 | 98 | 90 | 0.918 | 0.03 | ○ | ○ |
| Specimen 2 | Tape 3 | 4 | Tape 3 | 10 | 98 | 98 | 1.000 | 0 | ○ | × |
| Specimen 3 | Tape 1 | 4 | Tape 2 | 10 | 95 | 90 | 0.947 | 0.13 | × | ○ |
| Specimen 4 | Tape 1 | 4 | Tape 4 | 10 | 98 | 92 | 0.939 | 0.17 | × | × |

ALUMINUM NITRIDE PLATE

TECHNICAL FIELD

The disclosure herein discloses a technique relating to an aluminum nitride plate.

BACKGROUND ART

An aluminum nitride plate is known as a substrate on which a semiconductor is to be grown. The aluminum nitride plate is used as a substrate on which a group-Ill nitride semiconductor is to be grown since it has a lattice constant close to that of group-III nitride semiconductor. Japanese Patent Application Publication No. 2011-20900 (which will hereinafter be termed Patent Literature 1) describes an aluminum nitride plate (aluminum nitride laminated plate) where only the surface layer is monocrystalline and a portion other than the surface layer is polycrystalline. Although recognizing that monocrystalline aluminum nitride is useful as a substrate on which a semiconductor is to be grown, Patent Literature 1 fabricates the laminated plate including monocrystal and polycrystal owing to a difficulty in stably manufacturing a freestanding monocrystalline aluminum nitride plate (monocrystalline aluminum nitride plate having a handleable thickness). Specifically, to suppress warpage or the like from occurring in aluminum nitride due to a difference in lattice constant between aluminum nitride and a substrate (substrate on which aluminum nitride is to be grown), Patent Literature 1 forms a thin monocrystalline aluminum nitride layer on the substrate and forms a polycrystalline aluminum nitride layer on a surface of the monocrystalline layer.

Patent Literature 1 configures the monocrystalline layer and the polycrystalline layer such that the aluminum nitride plate varies in nitrogen (N) ratio. Patent Literature 1 uses the monocrystalline layer as a surface on which a semiconductor is to be grown. Since the semiconductor is grown on the monocrystalline layer, formation (growth) of a high-quality semiconductor is expected.

SUMMARY OF INVENTION

Technical Problem

In some semiconductor devices, their aluminum nitride plates may not be removed in the manufacturing process and be allowed to remain in the finished products (semiconductor devices). As described above, in the aluminum nitride plate of Patent Literature 1, the nitride ratio is varied between the monocrystalline layer and the polycrystalline layer. Specifically, in Patent Literature 1, the monocrystalline layer has a nitrogen content of 34.15 to 34.70 mass %, and the polycrystalline layer has a nitrogen content of 32.50 to 34.00 mass %. In this case, property difference between the monocrystalline layer and the polycrystalline layer of the aluminum nitride plate may affect functions of the semiconductor device. Therefore, even though a good-quality semiconductor is formed on the surface of the aluminum nitride layer, the functions of the semiconductor device may not be improved or may even be decreased. The disclosure herein provides an aluminum nitride plate that is useful as a substrate on which a semiconductor is to be grown.

Solution to Technical Problem

An aluminum nitride plate herein disclosed may satisfy both of the following relations (1) and (2)

$$c1 > 97.5\% \tag{1}$$

$$c2/c1 < 0.995 \tag{2}$$

where c1 is a c-plane degree of orientation that is defined as a ratio of a diffraction intensity of (002) plane to a sum of the diffraction intensity of (002) plane and a diffraction intensity of (100) plane when a surface layer of the aluminum nitride plate is subjected to an X-ray diffraction measurement along a thickness direction of the surface layer, and c2 is a c-plane degree of orientation that is defined as a ratio of the diffraction intensity of (002) plane to the sum of the diffraction intensity of (002) plane and the diffraction intensity of (100) plane when a portion other than the surface layer of the aluminum nitride plate is subjected to the X-ray diffraction measurement along a thickness direction of the portion. Moreover, in the aluminum nitride plate, a difference in nitrogen content between the surface layer and the portion other than the surface layer may be less than 0.15% in weight ratio. The c-plane degrees of orientation may be calculated from "c-plane degree of orientation (%)=I 002/(I 002+I 100)×100", where (I 002) is the diffraction intensity of (002) plane and (I 100) is the diffraction intensity of (100) plane.

The above-described aluminum nitride plate includes at least two layers, namely, the surface layer and the portion other than the surface layer (which will hereinafter be termed a lower layer). In the above-described aluminum nitride plate, the c-plane degree of orientation c1 of the surface layer is 97.5% or more. On the other hand, the c-plane degree of orientation c2 of the lower layer relative to the c-plane degree of orientation c1 of the surface layer is less than 99.5%. In other words, crystals in the surface layer are uniform in the c-axis orientation, and crystals in the lower layer are less uniform in the c-axis orientation as compared with the crystals in the surface layer. It should be noted that the "surface layer" herein means a portion included in a layer located at one end of the aluminum nitride plate out of 10 layers obtained by splitting the aluminum nitride plate into 10 along its thickness direction, and the portion is exposed at a surface of the aluminum nitride plate on the one end side. For example, when the layer located at the one end of the aluminum nitride plate that had been split into 10 layers in the thickness direction is further split into 10 layers in its thickness direction and a difference in the c-plane degree of orientation is found between one of the 10 layers that is exposed at the surface of the aluminum nitride plate and another of the 10 layers, the exposed layer is defined as the "surface layer". A ratio of the surface layer relative to the thickness of the aluminum nitride plate varies depending on the thickness of the aluminum nitride plate.

In the above-described aluminum nitride plate, the surface layer is uniform in the c-axis orientation (c-plane degree of orientation exceeding 97.5%), thus a good-quality (lessdefective) semiconductor can be grown on the surface of the aluminum nitride plate. Moreover, setting the c-plane degree of orientation c2 of the lower layer to be lower than the c-plane degree of orientation c1 of the surface layer relieves stress imposed from the semiconductor (semiconductor element portion) onto the aluminum nitride plate during a manufacturing process of the semiconductor device or during use thereof. Even when the c-plane degree of orientation c2 of the lower layer is at the same level as the c-plane degree of orientation c1 of the surface layer, a good-quality semiconductor can be grown on the surface of the aluminum nitride plate. In this case, however, the aluminum nitride plate has decreased strength (decreased fracture toughness), thus when a force due to the difference in thermal expansion coefficient between the grown semiconductor and the aluminum nitride plate is applied to the aluminum nitride plate, for example, this may facilitate deterioration of the aluminum nitride plate. The above-described aluminum nitride plate, in which the c-plane degree of orientation c2 of the lower layer is lower than the c-plane degree of orientation c1 of the surface layer, has increased strength and improved durability. Moreover, in the above-described aluminum nitride plate, the difference in nitrogen content between the surface layer and the portion other than the surface layer is less than 0.15% in weight ratio. In other words, the surface layer and the lower layer are substantially the same in chemical composition and in crystalline morphology. This suppresses distortion or the like between the surface layer and the lower layer due to the difference in lattice constant therebetween, for example. Consequently, it is also suppressed that the aluminum nitride plate adversely affects the semiconductor element portion, for example, applying a force like distortion to the semiconductor element portion.

In the above-described aluminum nitride plate, a half-value width in an X-ray rocking curve profile of (102) plane of an aluminum nitride crystal in the surface layer may be 2.5 degrees or less. This suppresses gaps from being generated between crystals configuring the surface layer and enables growth of a better-quality semiconductor.

In the above-described aluminum nitride plate, the c-plane degree of orientation c2 of the portion (the lower layer) other than the surface layer may be 97% or more. In other words, the lower layer may have a high c-plane degree of orientation within a range that satisfies the above relation (2). Setting the c-plane degree of orientation c2 to be 97% or more improves translucency of the lower layer. In other words, the aluminum nitride plate with high translucency can be obtained. The aluminum nitride plate can thus be used, for example, as a light-emitting portion of a light-emitting element such as an LED (substrate of the light-emitting element).

BRIEF DESCRIPTION OF DRAWINGS

FIG. 6 shows compositions of tape bodies used for fabricating aluminum nitride plates of embodiment; and FIG. 7 shows evaluation results of the aluminum nitride plates of embodiment.

DESCRIPTION OF EMBODIMENTS

Figure 1:
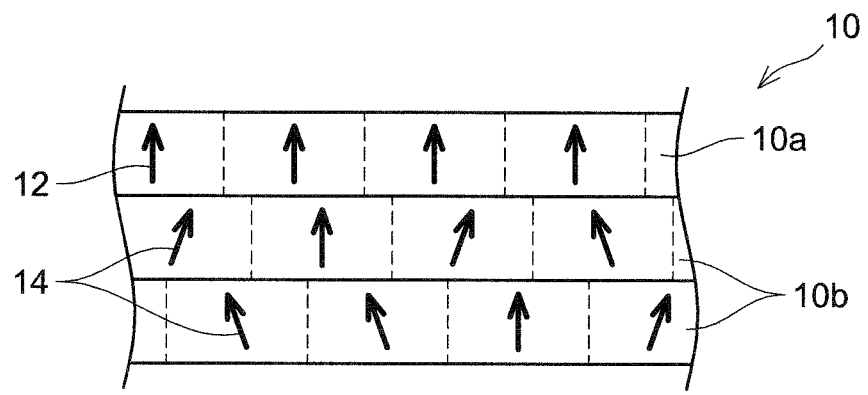
FIG. 1 shows a diagram for explaining characteristics of an aluminum nitride plate.

An embodiment of the technique disclosed herein will be described.

The disclosure herein discloses an aluminum nitride plate that is suitably used as a substrate on which a semiconductor, in particular, a group-III nitride semiconductor is to be grown. The aluminum nitride plate has high thermal conductivity and is suitably used as a substrate for a semiconductor device. The aluminum nitride plate disclosed herein has a flat plate shape and may have any outer shape such as, a rectangular shape or a circular shape. In a case where the aluminum nitride plate has a circular shape, a notch, an orientation flat, or the like may be formed thereon. Moreover, a thickness of the aluminum nitride plate may be 0.1 mm or more, 0.2 mm or more, 0.25 mm or more, 0.5 mm or more, 0.75 mm or more, or 1.0 mm or more, although not particularly limited thereto. The thickness being excessively small could cause damage or warpage in the aluminum nitride plate during transfer, and properties of the semiconductor device may be affected thereby. Moreover, the thickness of the aluminum nitride plate may be 10 mm or less, 5 mm or less, 3 mm or less, or 1 mm or less. The thickness being excessively large might cause application of a large force on a semiconductor element portion due to thermal expansion coefficient difference, or might hinder miniaturization of the semiconductor device.

The aluminum nitride plate may include at least a surface layer and a lower layer that differ from each other in the c-plane degree of orientation. The surface layer may be disposed on the lower layer (on a surface of the lower layer). The surface layer may include a front surface of the aluminum nitride plate (a surface on which a semiconductor is to be grown). A thickness of the surface layer may be 10 nm to 500 μm, although not particularly limited thereto. Although a ratio of the thickness of the surface layer relative to the thickness of the aluminum nitride plate varies depending on the thickness of the aluminum nitride plate, the thickness of the surface layer may be smaller than one-tenth of the thickness of the aluminum nitride plate. The lower layer may include a surface on which no semiconductor is grown (a rear surface of the aluminum nitride plate). In other words, the lower layer may be a portion other than the surface layer in the thickness direction of the aluminum nitride plate. A c-plane degree of orientation c1 of the surface layer may be more than 97.5%, more than 98%, or more than 99%. The smaller the c-axis tilt angle (inclined angle) of crystals (aluminum nitride crystals) configuring the surface layer is, the higher quality the resulting semiconductor has. Thus, in the aluminum nitride plate, the c-plane degree of orientation c1 of the surface layer may satisfy "relation 1: c1>97.5%". In a case where the c-plane degree of orientation c1 of the surface layer is 97.5% or less, a high-quality semiconductor would be difficult to obtain and defects might be generated in a semiconductor layer, for example.

The crystals of the surface layer are preferably uniform in the orientation about the t-axis. Specifically, a half-value width in an X-ray rocking curve profile of (102) plane of an aluminum nitride crystal in the surface layer may be 2.5 degrees or less. In other words, with a specific crystal set as a reference, the other crystals preferably are not rotated (twisted) about their c-axe with respect to the specific crystal. The more uniform in the orientation about the c-axis the crystals are, the smaller the above half-value width is. The half-value width in the X-ray rocking curve profile of (102) plane may be 2.0 degrees or less, 1.5 degrees or less, or 1.0 degrees or less. The half-value width being smaller (the crystals being more uniform in the orientation about the c-axis) makes gaps between the crystals smaller, thus enables growth of a high-quality semiconductor.

The c-plane degree of orientation c1 of the surface layer may be higher than a c-plane degree of orientation c2 of the lower layer. In other words, the c-plane degree of orientation c2 of the lower layer may be lower than the c-plane degree of orientation c1 of the surface layer. The c-plane degree of orientation c2 of the lower layer relative to the c-plane degree of orientation c1 of the surface layer may be less than 99.5%. In other words, "relation 2: c2/c1<0.995" may be satisfied, where c1% is the c-plane degree of orientation of the surface layer and c2% is the c-plane degree of orientation of the lower layer. With lower c-plane degree of orientation of the lower layer, the aluminum nitride plate has more improved fracture toughness and is less likely to be cracked. The c-plane degree of orientation of the lower layer may be adjusted within a range that satisfies the above relation 2, depending on the purpose. It should be noted, however, that a low c-plane degree of orientation of the lower layer may cause light scattering in the lower layer and decrease translucency therein. Thus, in a case where the aluminum nitride plate is used as a substrate for a semiconductor device that requires translucency, such as a light-emitting element, the c-plane degree of orientation of the lower layer may be set high within the range that satisfies the above relation 2. On the other hand, in a case where translucency is not required in the use of the aluminum nitride plate (e.g., in a case where the aluminum nitride plate is used as a substrate for a power semiconductor device), the c-plane degree of orientation c2 of the lower layer may be "52%". In other words, in case of the use that does not require translucency, the c-plane degree of orientation of the lower layer may be very low.

The aluminum nitride plate can have improved fracture toughness even though the c-plane degree of orientation c1 of the surface layer is low. As described above, however, the c-plane degree of orientation c1 of the surface layer is maintained high to achieve growth of a high-quality semiconductor. In the aluminum nitride plate disclosed herein, the c-plane degree of orientation c1 of the surface layer is maintained high and the c-plane degree of orientation c2 of the lower layer is set to be lower than that of the surface layer, to enable growth of a high-quality semiconductor and enhancement of fracture toughness of the aluminum nitride plate itself. In other words, the aluminum nitride plate may satisfy both of the above relations 1 and 2.

The c-plane degrees of orientation were measured by placing disk-shaped aluminum nitride plate on a specimen holder with its surface layer or lower layer facing upward, and irradiating the aluminum nitride plate with X ray. In the measurement of the c-plane degrees of orientation, an XRD profile was measured in a range of 2θ=20 to 70° by an XRD device (D8-ADVANCE made by Bruker-AXS). Specifically, the measurement was conducted using CuKα ray under a condition that a voltage was 50 kV and a current was 300 mA. The c-plane degrees of orientation (%) were calculated from "I 002/(I 002+I 100)×100", where (I 002) is a diffraction intensity of (002) plane and (I 100) is a diffraction intensity of (100) plane. Moreover, to obtain an indication of c-plane twist angle, the surface layer of the disk-shaped aluminum nitride plate was subjected to a rocking curve measurement (XRC) of (102) plane. The rocking curve measurement was conducted using an XRD device of D8-DISCOVER made by Bruker-AXS under a measurement condition that a voltage was 40 kV, a current was 40 mA, a collimator diameter was 0.5 mm, an anti-scattering slit was 3 mm, an ω step width was 0.01 degrees, and a counting time was 1 second. This measurement was conducted with CuKα ray monochromatized and collimated (a half-value width of 28 seconds) by a Ge(022) asymmetric monochromator. Based on the resulting XRC profile, a half-value width was obtained.

The aluminum nitride plate disclosed herein has the above-described advantages because the c-plane degrees of orientation of the crystals configuring the surface layer and the lower layer are adjusted. In the aluminum nitride plate disclosed herein, each of the surface layer and the lower layer is a polycrystalline body formed of multiple microcrystals. The surface layer and the lower layer may be polycrystalline bodies fabricated using substantially the same raw material (particulates including aluminum nitride crystal grains). That is, the surface layer and the lower layer are different in the c-plane degree of orientation but may be the same in the crystal structure of the crystals per se. In other words, the surface layer and the lower layer may be substantially the same in the chemical composition. As a specific indication, a difference in nitrogen content between the surface layer and the portion other than the surface layer may be less than 0.15% in weight ratio. Configuring the surface layer and the lower layer to have substantially the same chemical composition enables the surface layer and the lower layer to have substantially the same properties (physical and chemical properties). This suppresses distortion between the surface layer and the lower layer due to a difference in lattice constant between the layers, for example. Thus, it is suppressed that the aluminum nitride plate adversely affects a semiconductor element portion.

As mentioned above, the lower layer of the aluminum nitride plate disclosed herein can be fabricated by firing aluminum nitride powder. Specifically, the lower layer of the aluminum nitride plate can be fabricated by: fabricating a flat plate-shaped compact using aluminum nitride particulates, each of which is in plate shape with an aspect ratio of 3 or more; and then sintering the compact by atmospheric sintering, hot pressing, hot isostatic pressing (HIP), spark plasma sintering (SPS), or the like. In the manufacturing of the lower layer of the aluminum nitride plate, a sintering aid that facilitates the sintering of the plate-shaped aluminum nitride particulates may be used. Moreover, the sintered lower layer of the aluminum nitride plate may further be fired to remove the sintering aid remaining in the aluminum nitride plate.

The surface layer of the aluminum nitride plate can be fabricated using aluminum nitride particulates, each of which is in plate shape with an aspect ratio of 3 or more. Specifically, the aluminum nitride plate (the surface layer) can be fabricated by: firstly fabricating a flat plate-shaped compact using the plate-shaped aluminum nitride particulates with the aspect ratio of 3 or more by compacting them in a magnetically-oriented state, with tapes, or the like; and then sintering the compact by atmospheric sintering, hot pressing, hot isostatic pressing (HIP), spark plasma sintering (SPS), or the like. In the manufacturing of the surface layer of the aluminum nitride plate, a sintering aid that facilitates the sintering of the plate-shaped aluminum nitride particulates may be used. Moreover, the sintered surface layer of the aluminum nitride plate may further be fired to remove the sintering aid remaining in the aluminum nitride plate.

An aluminum nitride plate fabricated by hot pressing may also be described as follows. This aluminum nitride plate may be obtained by: fabricating a flat plate-shaped compact using aluminum nitride particulates, each of which is in plate shape with an aspect ratio of 3 or more; and sintering the compact by hot pressing. Moreover, the sintered aluminum nitride plate may satisfy both of the following relations (1) and (2):

$$c1 > 97.5\% \tag{1}$$

$$c2/c1 < 0.995 \tag{2}$$

where c1 is a c-plane degree of orientation that is defined as a ratio of a diffraction intensity of (002) plane to a sum of the diffraction intensity of (002) plane and a diffraction intensity of (100) plane when the surface layer of the aluminum nitride plate is subjected to an X-ray diffraction measurement along a thickness direction of the surface layer, and c2 is a c-plane degree of orientation that is defined as a ratio of the diffraction intensity of (002) plane to the sum of the diffraction intensity of (002) plane and the diffraction intensity of (100) plane when a portion other than the surface layer of the aluminum nitride plate is subjected to the X-ray diffraction measurement along a thickness direction of the portion. Moreover, in this aluminum nitride plate, a difference in nitrogen content between the surface layer and the portion other than the surface layer may be less than 0.15% in weight ratio.

Each of the plate-shaped aluminum nitride particulates is considerably small in size as compared with the aluminum nitride plate. For example, each of the aluminum nitride particulates may have a plane-direction length (c-plane size) L of 0.6 to 20 μm. If the plane-direction length L is excessively small, the particulates would aggregate, which makes it difficult to increase the c-plane degree of orientation of the crystals in the particulates. In contrast, if the plane-direction length L is excessively large, sintering would be difficult in the manufacturing of the aluminum nitride plate, which decreases a density of the aluminum nitride plate (relative density to theoretical density). Moreover, each of the aluminum nitride particulates may have a thickness-direction length D of 0.05 to 2 μm. If the thickness-direction length D is excessively small, the aluminum nitride particulates would likely to lose their shapes in the manufacturing of the aluminum nitride plate, which makes it difficult to increase the c-plane degree of orientation of the aluminum nitride plate (the surface layer, in particular). In contrast, if the thickness-direction length D is excessively large, in adjustment of the thickness of pre-firing compact by a doctor blade or the like, the aluminum nitride particulates receive the shearing stress imposed from the doctor blade onto the aluminum nitride particulates mainly on their lateral surfaces (surfaces parallel to the thickness direction), which could disarrange the alignment of the aluminum nitride particulates. Consequently, the c-plane degree of orientation of the aluminum nitride plate would be difficult to increase.

With reference to FIGS. 1 to 5, features of the aluminum nitride plate disclosed herein will be described. FIG. 1 schematically shows a cross section of an aluminum nitride plate 10. Arrows 12, 14 in the drawings each indicate a c-axis orientation. The aluminum nitride plate 10 includes a surface layer 10a having a high c-axis degree of orientation (c-plane degree of orientation) and a lower layer 10b having a lower c-axis degree of orientation than the surface layer 10a. The c-plane degrees of orientation of the surface layer 10a and the lower layer 10b satisfy the above-described relations 1 and 2. A semiconductor (not shown) is to be grown on a surface of the surface layer 10a, which has a high c-axis degree of orientation. In the aluminum nitride plate 10, the surface layer 10a plays a role in allowing a high-quality semiconductor to be grown thereon, and the lower layer 10b plays a role in relieving a force applied from a semiconductor element portion onto the aluminum nitride plate 10.

The aluminum nitride plate 10 is fabricated using the above-described plate-shaped aluminum nitride particulates. The surface layer 10a and the lower layer 10b are fabricated from substantially the same raw material (plate-shaped aluminum nitride particulates) and are almost the same in the chemical composition. With regard to nitrogen element contents in the surface layer 10a and the lower layer 10b, for example, they are approximately equal, and specifically, a difference therebetween is less than 0.15 wt %. Thus, the surface layer 10a and the lower layer 10b are also substantially the same in properties. Dashed lines partitioning the surface layer 10a and the lower layer 10b in FIG. 1 indicate that the surface layer 10a and the lower layer 10b are configured of the plate-shaped aluminum nitride particulates that had undergone grain growth by sintering and does not necessarily indicate grain boundaries.

The aluminum nitride plate 10 can be fabricated by: separately fabricating a surface layer sheet for the surface layer 10a having a high c-axis degree of orientation and a lower layer sheet for the lower layer 10b having a lower c-axis degree of orientation than the surface layer 10a; putting these sheets together; and then simultaneously sintering the surface layer 10a and the lower layer 10b by hot pressing. Specifically, the aluminum nitride plate 10 is fabricated by: applying raw materials for the respective sheets (the surface layer sheet, the lower layer sheet) on tapes (films) by a doctor blade method; laminating the tape bodies to form a laminated body (laminated body prior to sintering); and subjecting the laminated body to primary firing and secondary firing. Temperatures for the primary firing and the secondary firing are adjusted in a range of 1400 to 2100° C. In the primary firing, the laminated body is fired with pressure applied thereon (hot pressing). In the primary firing, the aluminum nitride particles grow. In the secondary firing, the laminated body is fired without pressure applied thereon. In the secondary firing, an aid remaining in the laminated body is removed.

The raw materials for the sheets (the surface layer sheet, the lower layer sheet) are slurry and can be generated by: producing a mixture of plate-shaped aluminum nitride particles and a firing aid such as calcium carbonate, yttria, and/or a Ca—Al—O-based aid; and adding a binder, a plasticizer, a disperser, and the like to the mixture. If needed, granular (spherical) aluminum nitride particles may be added to the slurry raw materials. The plate-shaped aluminum nitride particles used here each have a high aspect ratio (an aspect ratio of 3 or more).

Figure 2:
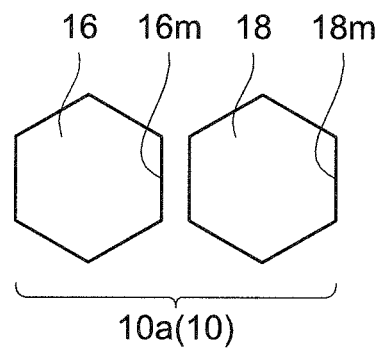
FIG. 2 shows a diagram for explaining characteristics of crystals that configure a surface layer.

FIG. 2 schematically shows aluminum nitride crystals 16, 18 that configure the surface layer 10a. FIG. 2 shows c-planes of the aluminum nitride crystals 16, 18. Aluminum nitride crystals have a hexagonal crystal structure and their m-planes are orthogonal to the c-axe. FIG. 2 shows an m-plane 16m of the aluminum nitride crystal 16 and an m-plane 18m of the aluminum nitride crystal 18. In the aluminum nitride plate 10, the aluminum nitride crystals configuring the surface layer 10a are uniform in the orientation about the c-axis. For example, with regard to the m-planes 16m and 18m of the aluminum nitride crystals 16 and 18, the m-plane 16m and the m-plane 18m are substantially parallel to each other. This is shown by an X-ray rocking curve profile of (102) plane of aluminum nitride crystals in the surface layer 10a.

Figure 3:
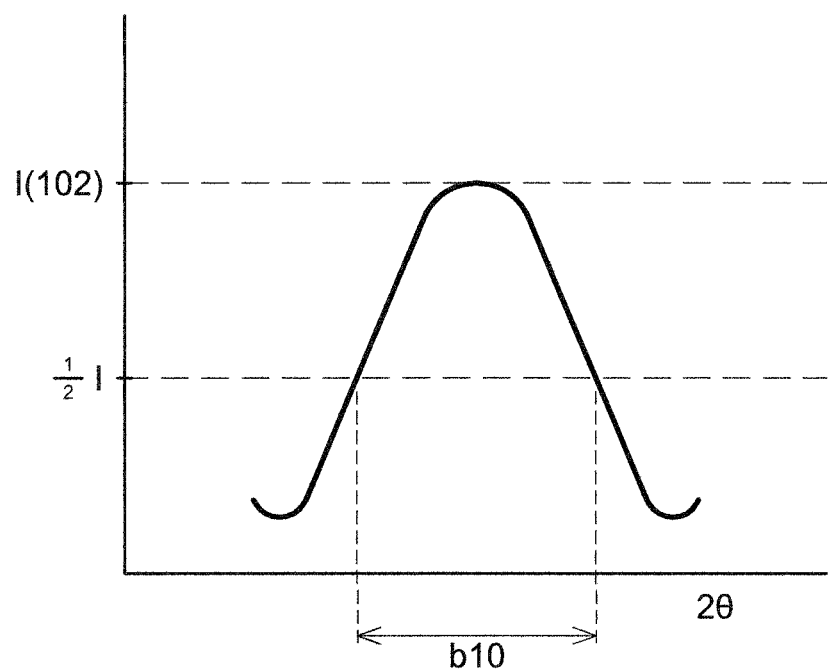
FIG. 3 shows an X-ray diffraction peak of the aluminum nitride crystal.

FIG. 3 shows a peak (highest peak) of the (102) plane of aluminum nitride crystals. Whether or not the aluminum nitride crystals in the surface layer 10a are uniform in the orientation about the c-axis can be determined from a half-value width in the X-ray rocking curve profile of (102) plane, which is obtained by measuring the surface layer 10a by an XRD device. In the aluminum nitride plate 10, a half-value width b10 of (102) plane in the surface layer 10a is 2.5 degrees or less. In other words, the aluminum nitride crystals in the surface layer 10a are uniform in the orientation about the c-axis.

Figure 4:
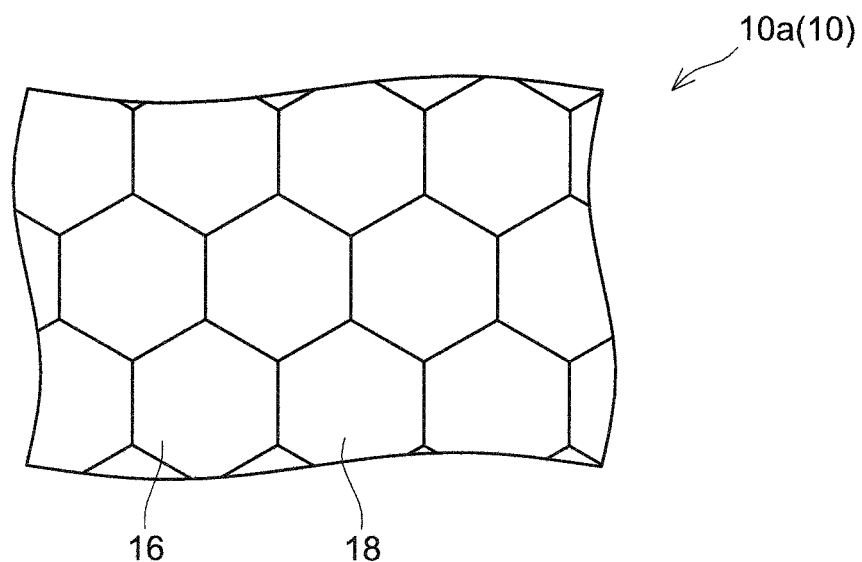
FIG. 4 shows a state in which the crystals configuring the surface layer have uniform m-plane direction.
Figure 5:
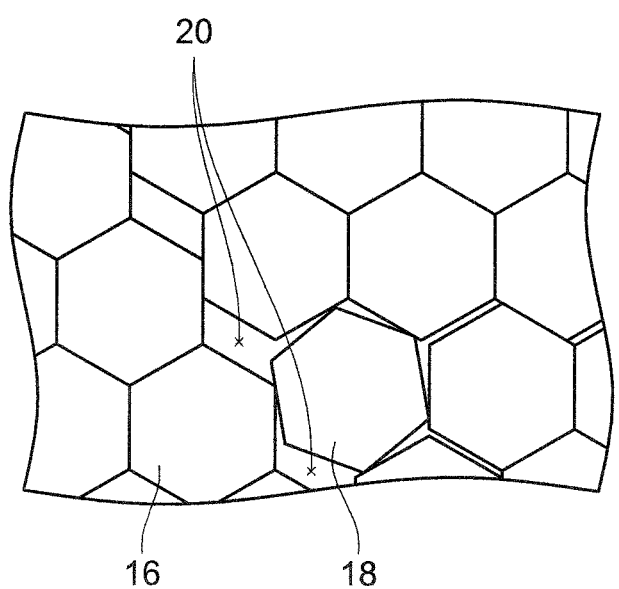
FIG. 5 shows a state in which the crystals configuring the surface layer do not have uniform m-plane direction.

FIG. 4 schematically shows the surface of the surface layer 10a. The aluminum nitride crystals uniform in the orientation about the c-axis as shown in FIG. 4 enables uniform crystal orientation in a semiconductor grown on the aluminum nitride crystals, so that the semiconductor has good quality (a few defects). On the other hand, the aluminum nitride crystals non-uniform in the orientation about the c-axis as shown in FIG. 5, for example, with the aluminum nitride crystal 18 rotated (twisted) relative to the aluminum nitride crystal 16, would cause a semiconductor grown on the aluminum nitride crystals to have rotated crystal orientations accordingly, which results in defects at interfaces where crystal orientations are different. A semiconductor with such defects is known to have degraded properties. In the aluminum nitride plate 10, the aluminum nitride crystals in the surface layer 10a are uniform in the orientation about the c-axis, and hence it can be used suitably as a substrate on which a semiconductor is to be grown.

EXAMPLES

A plurality of aluminum nitride plates was fabricated and evaluated in terms of their properties. The results will hereinafter be described. It should be noted that examples shown below are intended merely for describing the disclosure herein, but not for limiting the disclosure herein.

Firstly, a method of producing plate-shaped aluminum nitride particles, which are a raw material of the aluminum nitride plates, will be described. The plate-shaped aluminum nitride particles were manufactured by heat-treating plate-shaped aluminum oxide in a furnace with nitrogen flow. Specifically, 100 g of plate-shaped aluminum oxide (KINSEI MATEC CO., LTD.), 50 g of carbon black (Mitsubishi Chemical Corporation), 1000 g of alumina balls ($\varphi$2 mm), and 350 mL of isopropyl alcohol (WA) (Tokso IPA made by Tokuyama Corporation) were pulverized and mixed at 30 rpm for 240 minutes to obtain the mixture thereof. The plate-shaped aluminum oxide used here had mean particle diameters (plane-direction lengths) of 5 μm and 7 μm. The aluminum oxide with mean particle diameter of 5 μm had a mean thickness (thickness-direction length) of 0.07 μm and an aspect ratio of 70. The aluminum oxide with mean particle diameter of 7 μm had a mean thickness (thickness-direction length) of 0.1 μm and an aspect ratio of 70.

The alumina balls were removed from the obtained mixture, and then the mixture was dried by a rotary evaporator. The remaining mixture (the mixture of plate-shaped alumina and carbon) was then lightly disintegrated in a mortar (the is, the aggregated particles were separated with a relatively small force). Next, 100 g of the mixture was put into a carbon crucible. The carbon crucible was then placed in a furnace, heated to 1600° C. at a temperature increase rate of 200° C./hour with a nitrogen gas flow at 3 L/min, and then kept at 1600° C. for 20 hours. After the completion of heating, the carbon crucible was naturally cooled and the specimen was taken out from the crucible. The specimen was then subjected to heat treatment (post heat treatment) in a muffle furnace under an oxidizing atmosphere at 650° C. for 10 hours to obtain plate-shaped aluminum nitride particles. The post heat treatment was conducted to remove carbon remaining in the specimen.

Next, the resulting plate-shaped aluminum nitride particles were sorted for obtaining particles used as the raw material of the aluminum nitride plates. The aluminum nitride particles after the above-described heat treatment include single particles and aggregated particles. Thus, the aluminum nitride particles after the heat treatment were disintegrated and classified to sort out the single particles. Specifically, 100 g of the aluminum nitride particles after the heat treatment, 300 g of alumina balls ($\varphi$2 mm), and 60 mL of IPA (Tokso IPA made by Tokuyama Corporation) were put together and disintegrated at 30 rpm for 240 minutes. The alumina balls were then removed, and the mixture was dried by a rotary evaporator. Next, the dried aluminum nitride particles were classified by a precision air classifier (TC-15NSC made by Nisshin Engineering Inc.). Here, the classification diameters were set to be the same sizes as the mean particle diameters of the above-described plate-shaped aluminum oxide. The classified fine particles were used as the raw material of the aluminum nitride plates.

Next, a method of synthesizing a sintering aid used in manufacturing of the aluminum nitride plates will be described. A composite oxide of Ca and Al (Ca—Al—O-based aid) was manufactured as the sintering aid. Specifically, 56 g of calcium carbonate (Shilver-W made by Shiraishi Group), 19 g of y-alumina (TM-300D made by TAIMEI CHEMICALS Co., Ltd.), 1000 g of alumina balls ($\varphi$15 mm), and 125 mL of IPA (Tokso IPA made by Tokuyama Corporation) were pulverized and mixed at 110 rpm for 120 minutes to obtain the mixture thereof. The alumina balls were removed from the obtained mixture, and then the mixture was dried by a rotary evaporator to obtain mixed powder. Then 70 g of the mixed powder was put into an alumina crucible. The alumina crucible was placed in a furnace, heated to 1250° C. at a temperature increase rate of 200° C./hour in the atmosphere, and then kept at 1250° C. for 3 hours. After the completion of heating, the crucible was naturally cooled, and the product (sintering aid) was taken out from the crucible. The mole ratio of Ca to Al in the obtained sintering aid was "Ca:Al=3:1".

Next, preparation of raw materials for tape bodies will be described. Four types of raw materials (tape raw materials 1 to 4) were fabricated by adjusting ratios (mass ratios) of the above-described plate-shaped aluminum nitride particles, the above-described sintering aid, and commercially-available aluminum nitride particles (F-GRADE made by Tokuyama Corporation, a mean particle diameter of 1.2 μm). FIG. 6 shows details of the tape raw materials 1 to 4. Specifically, 300 g of alumina balls ($\varphi$15 mm) and 60 mL of IPA (Tokso IPA made by Tokuyama Corporation) were added to 20 g (total weight) of each tape raw material, and the mixture was pulverized and mixed at 30 rpm for 240 minutes. The alumina balls were then removed and the resultant was dried by a rotary evaporator to fabricate the tape raw materials 1 to 4.

The tape raw materials 1 to 4 were used to fabricate four types of tape bodies. Specifically, 7.8 parts by mass of polyvinyl butyral (item No. BM-2 made by SEKISUI CHEMICAL CO., LTD.) as a binder, 3.9 parts by mass of di(2-ethylhexyl)phthalate (made by KUROGANE KASEI Co., Ltd.) as a plasticizer, 2 parts by mass of sorbitan trioleate (Rheodol SP-030 made by Kao Corporation) as a disperser, and 2-ethylhexanol as a dispersion medium were added to 100 parts by mass of each tape raw material described above and mixed to fabricate raw material slurries. The added amount of the dispersion medium was adjusted such that the slurries had a viscosity of 20000 cP. The adjusted raw material slurries were applied respectively on PET films by a doctor blade method such that plate surfaces (c-planes) of the aluminum nitride particles were aligned along surfaces of tape bodies. Thicknesses of the slurries were adjusted to become 30 μm after drying. As above, the four types of tape bodies (tape bodies 1 to 4) were fabricated.

The tape bodies 1 to 4 were used to fabricate four types of aluminum nitride plates (specimens 1 to 4). Firstly, each of the tape bodies was cut into circles with diameter of 20 mm and the circles were laminated in predetermined numbers to fabricate four types of laminated bodies. FIG. 7 shows the types and the numbers of the tape bodies used for each laminated body (the specimens 1 to 4). Used tapes 1 to 4 in FIG. 7 respectively correspond to the tape bodies obtained from the tape raw materials 1 to 4 in FIG. 6. The laminated bodies were respectively placed on aluminum plates with a thickness of 10 mm and then packed in packages. Then, the packages were evacuated to yield vacuum packages. The vacuum packages were subjected to isostatic pressing under a pressure of 100 kgf/cm² in warm water at 85° C. to obtain disk-shaped laminated bodies.

Next, the specimens were subjected to primary firing. Specifically, the laminated bodies were firstly placed in a degreasing furnace and degreased at 600° C. for 10 hours, and then the degreased laminated bodies were fired, using a graphite mold, by hot pressing for 5 hours under a nitrogen atmosphere, a firing temperature (highest temperature) of 1850° C., and a surface pressure of 200 kgf/cm², for the primary firing of the specimens (laminated bodies). The pressure direction in the hot pressing was set to be the laminating direction of each laminated body (direction approximately orthogonal to the surface of the tape body). Moreover, the pressure was maintained until the temperature decreased to room temperature.

Next, the specimens after the primary firing were subjected to secondary firing. Firstly, surfaces of the specimens after the primary firing were ground to fabricate specimens with φ20 mm and a thickness of 0.35 mm. These specimens were put into an aluminum nitride sheath and fired in a furnace under a nitrogen atmosphere at a firing temperature (highest temperature) of 1900° C. for 75 hours, for the secondary firing of the specimens.

Next, the specimens after the secondary firing were roughly polished on their front surfaces (on surface layer sides of the aluminum nitride plates) and rear surfaces (on lower layer sides of the aluminum nitride plates). Then, these specimens were fixed respectively onto metal surface plates of φ68 mm, polished by a copper lapping machine onto which drops of slurry containing diamond abrasive grains with particle diameters of 9 μm and 3 μm had been applied, and further polished for 300 minutes by a buffing machine onto which drops of slurry containing colloidal silica had been applied. Then, the polished specimens were cleaned with acetone, ethanol, and ion-exchanged water in this order for 3 minutes each. Each of the specimens had a surface layer thickness of 50 μm and a lower layer thickness of 200 μm. The surface layer thickness and the lower layer thickness can be adjusted freely according to the number of tape bodies to be laminated and/or the polishing after the firing (after the secondary firing).

The obtained specimens (specimens 1 to 4) were evaluated in terms of the degree of orientation, difference in nitrogen content between the surface layer and the lower layer, the number of defects in the surface layer, and workability. FIG. 7 shows results of the evaluation. The evaluation methods will hereinafter be described.

For evaluation of the degree of orientation (c-plane degree of orientation), measurement surfaces (polished surfaces) of the surface layer and the lower layer of each specimen were irradiated with X ray. Specifically, XRD profiles were measured in a range of 2θ=20 to 70 degrees, using an XRD device (D8-ADVANCE made by Bruker-AXS) and CuKα ray, under a condition with a voltage of 50 kV and a current of 300 mA. The degree of orientation (f) was calculated by a Lotgering method. Specifically, the degree of orientation (f) was calculated by substituting P, $P_0$, which were obtained from the following relations (3) and (4), into the relation (2). In the relations, P represents a value obtained from XRD measurement of obtained specimen (aluminum nitride plate), and $P_0$ represents a value calculated from standard aluminum nitride (JCPDS card No. 076-0566). Further, (100), (002), (101), (102), (110), and (103) were used as (hkl).

$$f=\{(P-P_0)/(1-P_0)\}\times 100 \quad (2):$$

$$P_0=\Sigma I_0(002)/\Sigma I_0(hkl) \quad (3):$$

$$P=\Sigma I(002)/\Sigma I(hkl) \quad (4):$$

For evaluation of the difference in nitrogen content between the surface layer and the lower layer, a laminated body configured of only one type of the tape bodies was manufactured for each of the tape bodies 1 to 4, these laminated compacts were subjected to primary firing and secondary firing similarly to the above-described specimens 1 to 4, and the difference in nitrogen content was calculated from the nitrogen contents in the obtained specimens (aluminum nitride plates each configured of one type of the tape bodies). Specifically, the nitrogen contents in the specimens (specimens each configured of one type of the tape bodies) were measured by an oxygen nitrogen analyzer (EMGA-920 made by HORIBA, Ltd.), and the nitrogen contents in the lower layers of the tape bodies were subtracted from the nitrogen contents in the surface layers of the tape bodies used in the specimens 1 to 4 to yield the differences in nitrogen content.

As to the number of defects in the surface layer, the surface of each polished specimen was observed under a scanning electron microscope (JSM-6390 made by JEOL Ltd.) at a magnification of 3000 (20 fields or more), the number of unevenness defects (particles, crystal-induced pits or particles, scratches, level differences at grain boundaries, and the like) was counted, and then whether or not the number of defects was 100/mm² or less was evaluated. In FIG. 7, the specimens whose number of defects was 100/mm² or less are marked with "O", and the specimens whose number of defects exceeded 100/mm² are marked with "X".

The workability was evaluated by dicing each of the specimens and measuring a chipping width in the rear surface after the dicing. Specifically, a sintered alumina plate with a flat surface was prepared, and lower layer sides of the specimens were fixed to the surface (the flat surface) of the sintered alumina plate with wax. The specimens were then cut from their surface layer sides by a resin diamond blade of #400, at a blade rotating speed of 30000 rpm and a blade feeding speed of 3 mm/s. After the cutting, the specimens were removed from the sintered alumina plate, their lower layer sides were observed under an optical microscope to measure chipping widths in the rear surfaces (widths of chipping from the cutting surfaces located in the lower layer surfaces), and whether or not the chipping widths were 10 μm or less was evaluated. In FIG. 7, the specimens whose chipping widths in the rear surfaces were 10 μm or less are marked with "O", and the specimens whose chipping widths in the rear surfaces exceeded 10 μm are marked with "X".

As shown in FIG. 7, it was confirmed that the specimens 1 and 2, each of which had a small difference in nitrogen content between the surface layer and the lower layer (less than 0.15%) and a high degree of orientation of the surface layer (exceeding 97.5%), had a small number of defects in the surface layers (100/mm² or less). The specimen 4 had a high degree of orientation of the surface layer, however, it had a large difference in nitrogen content between the surface layer and the lower layer (0.15% or more). These results suggest a small difference in nitrogen content between the surface layer and the lower layer (almost the same chemical composition between these layers) suppresses distortion or the like due to a difference in lattice constant between the surface layer and the lower layer, and thus suppresses crystal defects in the surface layer. It was also confirmed from the results of the specimens 1 and 3 that what is required to decrease the number of defects in the surface layer is not only a small difference in nitrogen content between the surface layer and the lower layer (less than 0.15% in both specimens) but also a high degree of orientation of the surface layer (exceeding 97.5%).

The specimen 2 had a small number of defects in the surface layer, thus was useful as a substrate on which a semiconductor is to be grown (substrate that is to be removed from the semiconductor device after manufacturing). However, it was confirmed that in a case where the aluminum nitride plate remains in the finished product (semiconductor device), the surface layer and the lower layer are preferably different in the degree of orientation (the surface layer/the lower layer<0.995) as in the specimen 1. Although not shown in FIG. 7, in a case where the degree of orientation of the surface layer is low (97.5% or less) and a difference in degree of orientation between the surface layer and the lower layer is small (surface layer/lower layer≥0.995), it is difficult at least to suppress defects in the surface layer even with a high nitrogen content in the surface layer (exceeding 97.5%), as understood from the result of the specimen 3.

The results of the examples show that an aluminum nitride plate that satisfies the "relation 1: c1>97.5%" and the "relation 2: c2/c1<0.995", where c1 is a c-plane degree of orientation of the surface layer of the aluminum nitride plate and c2 is a c-plane degree of orientation of the lower layer (portion other than the surface layer) of the aluminum nitride plate, and has a difference in nitrogen content between the surface layer and the lower layer of less than 0.15% (in weight ratio) is useful as a substrate on which a high-quality semiconductor is to be grown and superior in strength (fracture toughness).

While specific examples of the present disclosure have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present disclosure is not limited to the combinations described at the time the claims are filed. Further, the purpose of the examples illustrated by the present description or drawings is to satisfy multiple objectives simultaneously, and satisfying any one of those objectives gives technical utility to the present disclosure.

The invention claimed is:

1. An aluminum nitride plate, wherein the aluminum nitride plate satisfies-both all three of following relations (1), (2) and (3), $$c1 > 97.5\% \quad (1):$$

$$c2 > 97\% \quad (2):$$

$$c2/c1 < 0.995 \quad (3):$$

where c1 is a c-plane degree of orientation that is defined as a ratio of a diffraction intensity of (002) plane to a sum of the diffraction intensity of (002) plane and a diffraction intensity of (100) plane when a surface layer of the aluminum nitride plate is subjected to an X-ray diffraction measurement along a thickness direction of the surface layer, and c2 is a c-plane degree of orientation that is defined as a ratio of the diffraction intensity of (002) plane to the sum of the diffraction intensity of (002) plane and the diffraction intensity of (100) plane when a portion other than the surface layer of the aluminum nitride plate is subjected to the X-ray diffraction measurement along a thickness direction of the portion, and a difference in nitrogen content between the surface layer and the portion other than the surface layer is less than 0.15 percent in weight ratio, wherein the surface layer is a portion included in a layer located at one end of the aluminum nitride plate out of 10 layers obtained by splitting the aluminum nitride plate into 10 along its thickness direction, and the portion is exposed at a surface of the aluminum nitride plate on the one end.

2. The aluminum nitride plate according to claim 1, wherein a half-value width in an X-ray rocking curve profile of (102) plane of an aluminum nitride crystal in the surface layer is 2.5 degrees or less.

* * * * *